United States Patent
Prakash et al.

(10) Patent No.: US 9,631,065 B2
(45) Date of Patent: Apr. 25, 2017

(54) METHODS OF FORMING WAFER LEVEL UNDERFILL MATERIALS AND STRUCTURES FORMED THEREBY

(71) Applicant: INTEL CORPORATION, Santa Clara, CA (US)

(72) Inventors: Anna M. Prakash, Chandler, AZ (US); James C. Matayabas, Gilber, AZ (US); Arjun Krishnan, Chandler, AZ (US); Nisha Ananthakrishnan, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 461 days.

(21) Appl. No.: 13/795,021

(22) Filed: Mar. 12, 2013

(65) Prior Publication Data
US 2014/0264827 A1     Sep. 18, 2014

(51) Int. Cl.
| | | |
|---|---|---|
| *H01L 21/56* | (2006.01) | |
| *H01L 23/29* | (2006.01) | |
| *C08K 5/00* | (2006.01) | |
| *H01L 21/78* | (2006.01) | |
| *B23K 26/18* | (2006.01) | |
| *B23K 26/364* | (2014.01) | |

(52) U.S. Cl.
CPC ............ *C08K 5/005* (2013.01); *B23K 26/18* (2013.01); *B23K 26/364* (2015.10); *H01L 21/563* (2013.01); *H01L 21/78* (2013.01); *H01L 2924/0002* (2013.01)

(58) Field of Classification Search
CPC .......... C08G 59/306; H01L 2924/0002; H01L 24/73; H01L 23/3142; H01L 2224/8385; H01L 2924/0665; H01L 23/295; H01L 2224/13099; H01L 2224/11; H01L 2224/16225; H01L 2224/73204; H01L 2224/32225; H01L 21/563; H01L 24/83; H01L 2224/81191; C08K 5/005

USPC ........ 438/124, 125, 126, 127, 610; 257/687, 257/778, 787–795, E23.116, E21.502

See application file for complete search history.

(56) References Cited

U.S. PATENT DOCUMENTS

| | | | | |
|---|---|---|---|---|
| 5,478,402 | A * | 12/1995 | Hanoka .................... | 136/251 |
| 6,160,308 | A * | 12/2000 | Aoki ....................... | 257/678 |
| 6,649,445 | B1 * | 11/2003 | Qi et al. ................. | 438/108 |
| 7,279,362 | B2 * | 10/2007 | Li et al. .................. | 438/114 |
| 7,604,152 | B2 * | 10/2009 | Ochiai et al. ........... | 228/111.5 |
| 8,455,936 | B2 * | 6/2013 | O'Neill ............. | G11C 29/1201 257/296 |
| 2003/0111519 | A1 * | 6/2003 | Kinney .............. | B23K 35/3613 228/223 |
| 2003/0144414 | A1 * | 7/2003 | Bogner ............... | C08K 5/13 524/714 |

(Continued)

*Primary Examiner* — Jasmine Clark
(74) *Attorney, Agent, or Firm* — Blakely, Sokoloff, Taylor & Zafman LLP (57) ABSTRACT

Methods of forming microelectronic packaging structures and associated structures formed thereby are described. Those methods and structures may include forming a wafer level underfill (WLUF) material comprising a resin material, and adding at least one of a UV absorber, a sterically hindered amine light stabilizer (HALS), an organic surface protectant (OSP), and a fluxing agent to form the WLUF material. The WLUF is then applied to a top surface of a wafer comprising a plurality of die.

42 Claims, 4 Drawing Sheets

(56) References Cited

U.S. PATENT DOCUMENTS

| | | | |
|---|---|---|---|
| 2007/0284758 A1* | 12/2007 | Zhang | H01L 21/563 257/780 |
| 2008/0213978 A1* | 9/2008 | Henry | B08B 5/00 438/462 |
| 2013/0197129 A1* | 8/2013 | Akiba et al. | 523/433 |
| 2015/0183923 A1* | 7/2015 | Potisek | C07D 301/03 522/31 |

* cited by examiner

FIG. 4

METHODS OF FORMING WAFER LEVEL UNDERFILL MATERIALS AND STRUCTURES FORMED THEREBY

BACKGROUND OF THE INVENTION

As microelectronic packaging technology advances for higher processor performance, wafer level underfill (WLUF) materials and techniques have found applications in microelectronic device processing, such as in first level interconnect and second level interconnect processing. In wafer level underfill processing, an underfill material may be applied to an entire wafer prior to singulation processing. In some cases, WLUF materials may be exposed to rigorous saw and laser scribing processes, as the wafer comprising the WLUF material undergoes die preparation and singulation. Such sawing and laser scribing may produce much debris on the wafer and consequently on individual die, which can impair device yields due to consequent opens, non-wetting of metallic material in the circuitry of the die, etc.

BRIEF DESCRIPTION OF THE DRAWINGS

While the specification concludes with claims particularly pointing out and distinctly claiming certain embodiments, the advantages of these embodiments can be more readily ascertained from the following description of the invention when read in conjunction with the accompanying drawings in which:

DETAILED DESCRIPTION OF THE PRESENT INVENTION

In the following detailed description, reference is made to the accompanying drawings that show, by way of illustration, specific embodiments in which the methods and structures may be practiced. These embodiments are described in sufficient detail to enable those skilled in the art to practice the embodiments. It is to be understood that the various embodiments, although different, are not necessarily mutually exclusive. For example, a particular feature, structure, or characteristic described herein, in connection with one embodiment, may be implemented within other embodiments without departing from the spirit and scope of the embodiments. In addition, it is to be understood that the location or arrangement of individual elements within each disclosed embodiment may be modified without departing from the spirit and scope of the embodiments. The following detailed description is, therefore, not to be taken in a limiting sense, and the scope of the embodiments is defined only by the appended claims, appropriately interpreted, along with the full range of equivalents to which the claims are entitled. It will be appreciated that for simplicity and clarity of illustration, elements in the drawings have not necessarily been drawn to scale. For example, the dimensions of some of the elements may be exaggerated relative to other elements for clarity. Further, where considered appropriate, reference numerals have been repeated among the drawings to indicate corresponding or analogous elements. For example, like numerals may refer to the same or similar functionality throughout the several views.

Methods and associated structures of forming and utilizing microelectronic structures, such as packaging structures comprising underfill materials, such as wafer level underfill materials, are described. Those methods/structures may include forming an wafer level underfill material comprising at least one of an ultra-violet (UV) absorber, an organic surface protectant (OSP), a sterically hindered amine light stabilizer (HALS) and a fluxing agent. The underfill structures of the various embodiments disclosed herein greatly improve the WLUF material ability to withstand harsh processing during laser scribe and saw processing, for example.

Figure 1:
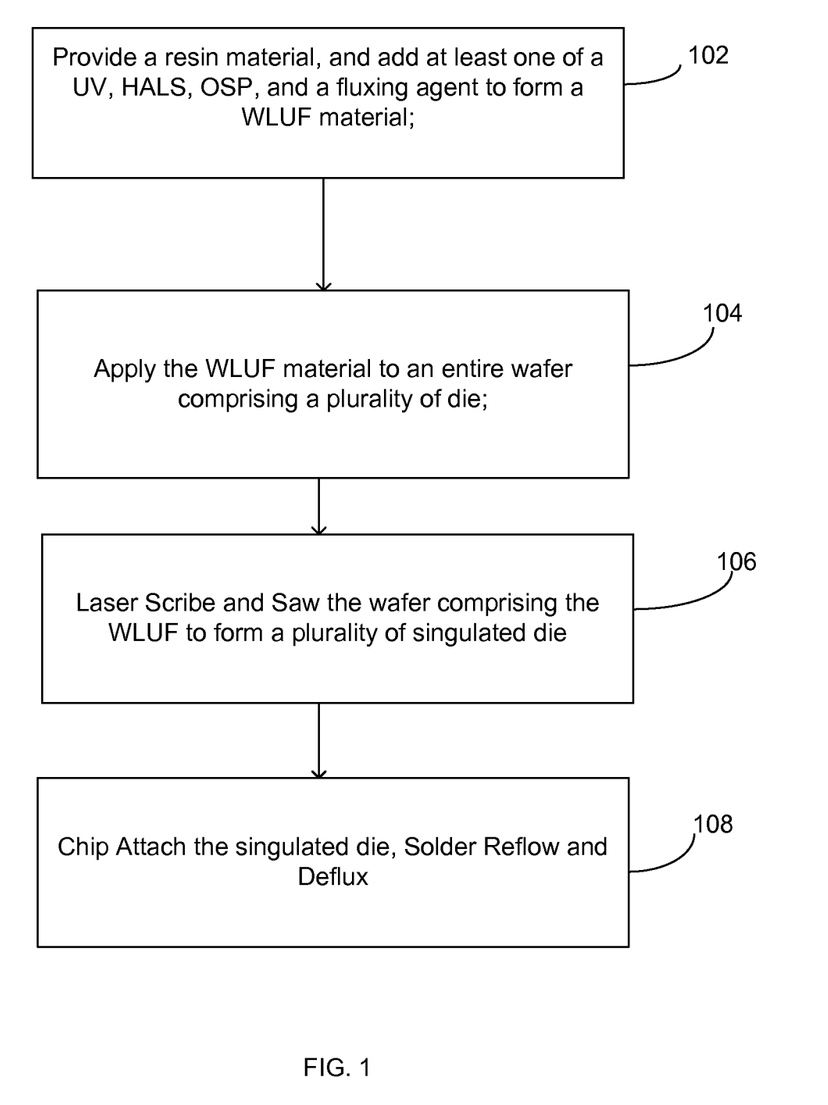
FIG. 1 represents a flow chart according to various embodiments.

FIG. 1 illustrates a flow chart of embodiments of forming microelectronic structures, such as portions of package structures comprising a WLUF material. In an embodiment, at step 102, a resin material/formulation may be provided, and at least one of a UV absorber, a HALS, an OSP and a fluxing agent may be added to the resin material to form a WLUF material. The resin material may comprise a base resin, and may additionally include a filler, a hardener, and a surfactant, in an embodiment. The resin material may also comprise an epoxy material, an acrylic or a pi resin material, or the resin material may comprise an acrylate based resin material, a polyimide, or a combination of the aforementioned materials, which may also include thermally stable resin materials. In an embodiment, the resin material may be combined with fillers, hardeners, and other such components in varying small amounts.

The UV absorber may comprise organic additives capable of absorbing the radiation of a lasers' operating frequency during a scribing operation, for example. In an embodiment, the UV absorber is capable of absorbing radiation in the UV-A portion of the electromagnetic spectrum. The UV absorber may comprise an organic additive in an embodiment. The UV absorber can include molecules such as benzophenes, diphenly acrylates, cinnamates and sterically hindered amines, in some embodiments. The UV absorber is generally soluble in the resin material. The UV absorber may comprise a range of UV absorptive compositions that may be optimized depending upon the particular processing conditions.

In an embodiment, the UV absorber may comprise between about 0.01 weight percent to about 10 weight percent composition of the WLUF material. The degree of solubility of the additive can depend upon the molecular group(s) attached to it. In some cases, the amount of UV absorber added to the resin material may depend upon the efficiency of the UV absorber (i.e., its ability to absorb UV radiation) and the amount of UV absorption required for a particular laser scribing operation. In an embodiment, the amount of UV absorber added to the epoxy material depends upon the need to optimize the scribing process, including debris formation and shallow scribe issues.

In an embodiment, the UV absorber may comprise a Uvinul type of light stabilizer. In an embodiment, the UV absorber may comprise a benzotriazole, such as Uvinul 3027. In an embodiment, the UV absorber may comprise an additive that may absorb laser energy in the range of about 200 to about 400 nm. Since the UV absorber in the WLUF material serves to enhance the WLUF's ability to absorb the laser energy during wafer scribing, easy ablation is facilitated. Additionally, the UV absorber can be added to the resin material wafer in specific amounts that permit tuning the degree of UV absorption/ablation required by the laser process. The ability to vary the amount of UV absorber in the WLUF material also provides an ability to adjust the wafer coat layer's UV absorption independent from its thickness. This can be a consideration with respect to throughput at the laser scribing operation (i.e. the amount of UV absorber in thick wafer coat layers can be reduced/ increased to improve laser scribing cycle time).

In an embodiment, the HALS additive to the resin material may be based on Uvinul type of monomeric and/or oligomeric HALS molecules. For example, the HALS additive may comprise a Uvinul 4050 H, such as a sterically hindered monomeric amine. In another embodiment, the HALS may comprise an oligomeric sterically hindered amine, such as Uvinul 5050 H. In another embodiment, a mixture of a UV absorber, a HALS additive and an antioxidant may be added to the resin material, such as Uvinul 3434C, which comprises a blend of UV absorber, HALS and antioxidant. Other classes of light stabilizers and antioxidants that are not Uvinul based may also be used as the HALS additive in some embodiments. These may include Tinuvin P, Irganox 1098, Lavinix BHT, Tinuvin 320, Irganox 1010, Irganox 1076, Irgafos 168, and combinations thereof.

The HALS additive in the WLUF formulation enables stability of the WLUF material without the dependency on thickness variation. This prevents delamination at interfaces, and increases surface roughness of the WLUF, which is useful during subsequent assembly processes to improve wettability with capillary underfill (CUF) or other under fill materials. Defects caused by thickness variations can cause damage to device layers in adjacent semiconductor die during the wafer sawing process. HALS additionally adds temperature robustness to the WLUF material, wherein the WLUF is capable of withstanding high temperatures without experiencing significant degradation.

The OSP additive in the WLUF formulation extends the functionality of the WLUF to include protection of bumps, such as solder connections, of the individual die of the wafer, from surface oxidation. Bump oxidation may occur during normal assembly processing of packaging structures. In an embodiment, the OSP in the WLUF material may remain on die bump surfaces, thus preventing oxidation during assembly before chip attach processing. In an embodiment, the OSP additive to the resin material may comprise alkylbenzimidazoles, vinyl benzimidazole, aryl phenylimidazoles and their substituted variants.

In an embodiment, alkylbenimidazoles may be useful in first level integration applications since the decomposition temperatures tend to be lower than the higher decomposition temperatures typically used in second level integration application. For second level integration processes, vinyl benzimidazole, aryl phenylimidazoles and their substituted variants may be used in some cases. In an embodiment, the OSP may remain on die bumps after laser scribe during the time between die prep and chip-attach. In an embodiment, the OSP additive may not degrade below a solder reflow temperature, which may comprise above about 350 degrees Celsius.

In an embodiment, the fluxing agent may be added to the resin material. The fluxing agent additive in the WLUF helps in soldering of conductive material, during chip attach, for example, without adding additional flux spray steps, thus improving throughput. In an embodiment, the fluxing agent may comprise at an acid and/or an activator package. In an embodiment, the fluxing agent may comprise about 1 percent to about 10 percent of the WLUF material composition. In an embodiment, the fluxing agent may comprise at least one of a carboxylic acid, a fatty acid, an oleic acid, a stearic acid, a dicarboxylic acid, an amino acid, a halide and an organohalide. In an embodiment, the total amount of the WLUF additives (UV absorber, OSP, HALS and fluxing agent) may comprise about 10 percent or less by weight. In another embodiment, the total amount of the WLUF additives may comprise below about 2 percent by weight.

Referring back to FIG. 1, at step 104, the WLUF material may be applied to/over a top surface of an entire wafer. The wafer may comprise a microelectronic wafer that may in turn comprise a plurality of microelectronic die/devices. The WLUF may be applied to bumps, such as copper comprising bumps, that are disposed on the die. At step 106, the wafer comprising the WLUF may undergo laser scribe and saw operations to form a plurality of singulated die. At step 110, the singulated die may undergo chip attach, solder reflow and deflux operations. In some prior art processes, the die may be exposed (not covered with WLUF underfill) prior to and during chip attach processing.

Figure 2A:
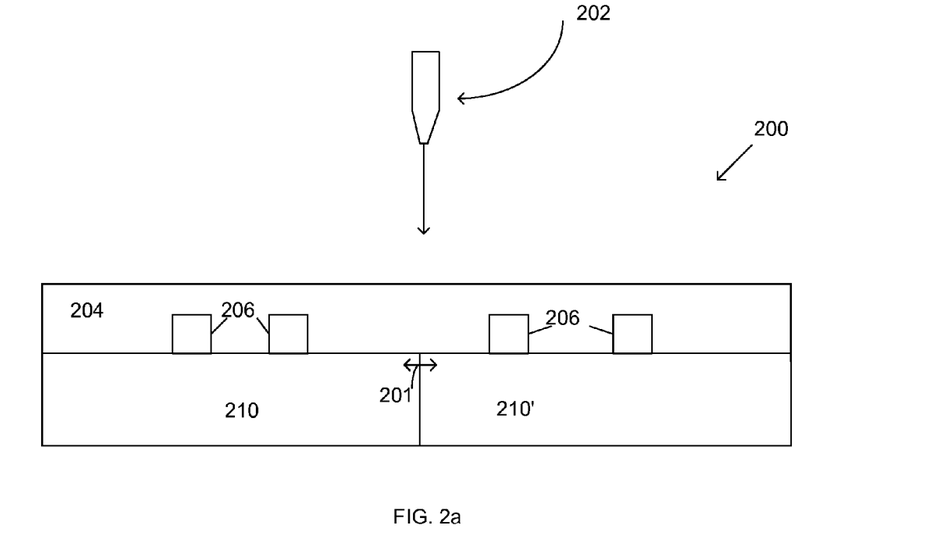
FIGS. 2a-2b represent cross-sectional views of structures according to embodiments.

During laser scribe and saw processing, wherein a wafer may be singulated into single die, much debris can be created which can then be deposited around adjacent devices. In some prior art processes, multiple pass laser scribe processing may be employed to lower the amount of debris generated. However, this increases throughput time and frequently does not eliminate the debris from impacting yield. In an embodiment, a WLUF material 204 may comprise a UV absorber, and may additionally comprise a HALS, an OSP, and a fluxing agent (FIG. 2a, depicting a cross-sectional view of a portion of a microelectronic wafer).

The WLUF material 204 may be disposed over an entire wafer 200, wherein the wafer 200 comprises a scribe area 201 and a plurality of die 210, 210'. A laser may perform a scribing process 202, in which the WLUF material 204 disposed on the streets/scribe line surface may be ablated/ burned away during the laser scribe operation 202 due to the UV absorption of the laser radiation by the UV absorber in the WLUF, rather than being mechanically displaced onto the surrounding devices 210, 210' and/or onto bump surfaces 206, which may cause yield loss and device damage due to opens etc. In an embodiment, the WLUF comprising the UV absorber is substantially ablated in scribe alleys of the wafer 200, and there is little to no debris on and around the plurality of die of the wafer 200. In an embodiment, the laser scribe and saw process may comprise a temperature below about 350 degrees Celsius.

Figure 2B:
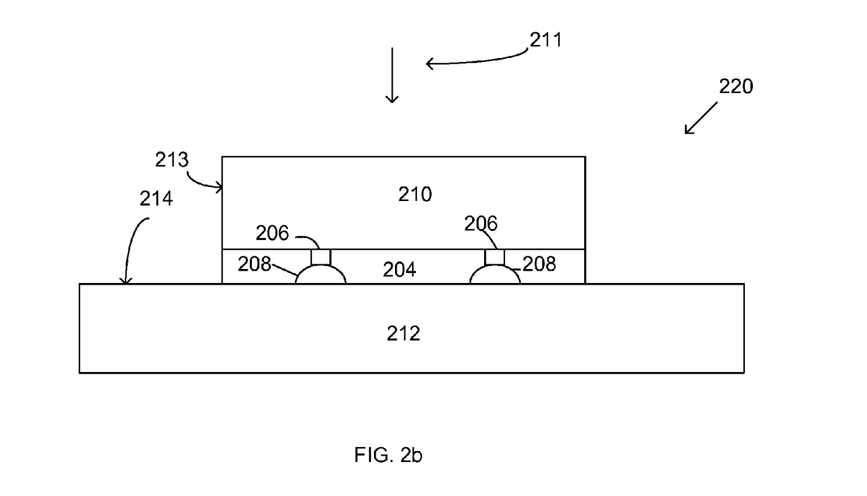

After the wafer 200 undergoes laser scribe and saw processes, a singulated die 210 comprising the WLUF material 204 may be attached to a substrate 212 to form a portion of a package structure 220, in an embodiment (FIG. 2b, cross-section). The singulated die 210 (comprising bumps 206) may be attached to the substrate 212 utilizing a chip attach process 211. In an embodiment, a separate flux application prior to chip attach is not necessary, since the WLUF material comprises the fluxing agent additive. In an embodiment, the OSP additive in the WLUF material 204 may remain on die bumps 208 before chip-attach, thus preventing oxidation of the conductive bump structures 206 during assembly before chip attach processing. At chip attach, OSP may degrade/be removed from the bump structures as the OSP may experience reflow temperatures exceeding about 350 degrees Celsius, in some embodiments. In an embodiment, the WLUF material 204 may not be substantially disposed on a top surface 214 of the substrate 212 adjacent an edge 213 of the die 210.

In an embodiment, the package structure 220 comprises conductive bumps 206 that are disposed on a bottom surface of the device 210, and solder connections 208 disposed on a package substrate 212 that are physically and electrically coupled with the conductive bumps 206. The WLUF material 204 surrounds the conductive bumps 206. In an embodiment, each of the conductive bumps 206 may comprise an electrically conductive terminal on the device 210 (e.g., a pad, bump, stud bump, column, pillar, or other suitable structure or combination of structures).

Solder (e.g., in the form of balls or bumps) may be disposed on the terminals of the substrate and/or die, and these terminals may then be joined using a solder reflow process, for example. Of course, it should be understood that many other types of interconnects and materials are possible (e.g., wirebonds extending between the device 210 and the substrate 212). Pads may be disposed on the substrate side instead of solder structures, such as enig materials, etc, in some cases.

The conductive bumps 206 on the device 210 may comprise any suitable material or any suitable combination of materials, whether disposed in multiple layers or combined to form one or more alloys and/or one or more intermetallic compounds. For example, the conductive bumps 206 may include copper, aluminum, gold, silver, nickel, titanium, tungsten, as well as any combination of these and/or other metals. In other embodiments, a conductive bump 206 may comprise one or more non-metallic materials (e.g., a conductive polymer). The solder connections 208 may also comprise any suitable material or any suitable combination of materials, whether disposed in multiple layers or combined to form one or more alloys and/or one or more intermetallic compounds. For example, the solder connections 208 may include copper, aluminum, gold, silver, nickel, titanium, tungsten, as well as any combination of these and/or other metals.

The device 210 may comprise one of a microelectronic memory die and a central processing unit die in some cases, but may comprise any type of suitable device 210 according to the particular application in other cases. In an embodiment, the device 210 may further comprise redistribution layer (RDL) and embedded wafer level ball grid array (eWLB) configurations. In an embodiment, the package structure 220 may comprise a coreless, bumpless build up layer (BBUL) package structure 220.

In the package structure of FIG. 2*b*, the device 110 may be disposed in other locations, such as on a top surface of a BBUL package, for example, and the package structure 220 may comprise any suitable type of package structures capable of providing electrical communications between a microelectronic device, such as a die and a next-level component to which the package structures may be coupled (e.g., a circuit board). In another embodiment, the package structures herein may comprise portions of any suitable type of package structures capable of providing electrical communication between a die and an upper integrated circuit (IC) package coupled with a lower IC package.

The package substrate 212 of the embodiments herein may comprise a multi-layer substrate—including alternating layers of a dielectric material and metal—built-up around a core layer (either a dielectric or metal core). In another embodiment, the package substrate 212 may comprise a coreless multi-layer substrate. Other types of substrates and substrate materials may also find use with the disclosed embodiments (e.g., ceramics, sapphire, glass, etc.).

The device 210 may comprise a silicon logic die or a memory die, for example, or any type of suitable microelectronic device/die, and may be disposed on a back side or on a front side of the package structures herein. In some embodiments the package structure 220 may further comprise a plurality of dies, which may be stacked upon one another, depending upon the particular embodiment. In some cases the die(s) may be located/attached/embedded on either the front side, back side or on/in some combination of the front and back sides of the package structures. In an embodiment, the die(s) may be partially or fully embedded in the package structures of the embodiments.

The various embodiments of WLUF package structures and methods included herein enable a robust WLUF performance during laser saw and scribe processing. The WLUF incorporation of at least one of the UV absorber additive, HALS, OSP and fluxing additives increase ablation, decrease debris on devices while protecting the device from bump oxidation, and thus greatly increasing reliability and yield, and throughput.

Figure 3:
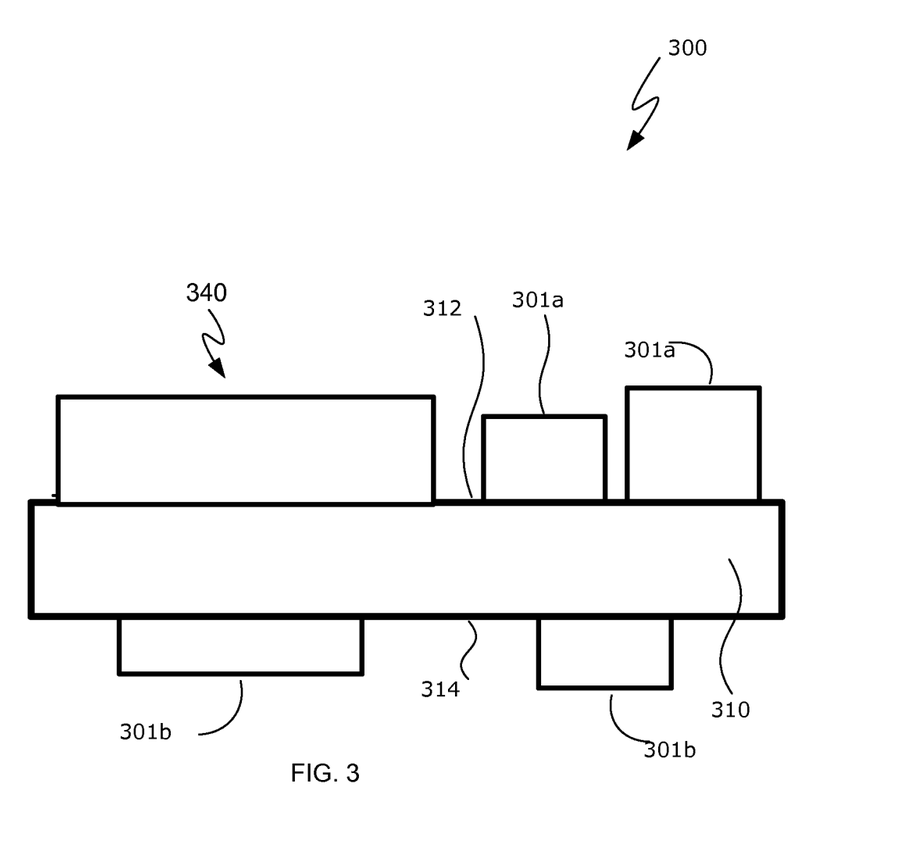
FIG. 3 represents a cross-sectional view of a structure according to embodiments.

Turning now to FIG. 3, illustrated is an embodiment of a computing system 300. The system 300 includes a number of components disposed on a mainboard 310 or other circuit board. Mainboard 310 includes a first side 312 and an opposing second side 314, and various components may be disposed on either one or both of the first and second sides 312, 314. In the illustrated embodiment, the computing system 300 includes a package structure 340 (which may be similar to the package structure 220 of FIG. 2, for example) disposed on the mainboard's first side 312, wherein the package structure 340 may comprise any of the WLUF material embodiments described herein.

System 300 may comprise any type of computing system, such as, for example, a hand-held or mobile computing device (e.g., a cell phone, a smart phone, a mobile internet device, a music player, a tablet computer, a laptop computer, a nettop computer, etc.). However, the disclosed embodiments are not limited to hand-held and other mobile computing devices and these embodiments may find application in other types of computing systems, such as desk-top computers and servers.

Mainboard 310 may comprise any suitable type of circuit board or other substrate capable of providing electrical communication between one or more of the various components disposed on the board. In one embodiment, for example, the mainboard 310 comprises a printed circuit board (PCB) comprising multiple metal layers separated from one another by a layer of dielectric material and interconnected by electrically conductive vias. Any one or more of the metal layers may be formed in a desired circuit pattern to route—perhaps in conjunction with other metal layers—electrical signals between the components coupled with the board 310. However, it should be understood that the disclosed embodiments are not limited to the above-described PCB and, further, that mainboard 310 may comprise any other suitable substrate.

In addition to the package structure 340, one or more additional components may be disposed on either one or both sides 312, 314 of the mainboard 310. By way of example, as shown in the figures, components 301*a* may be disposed on the first side 312 of the mainboard 310, and components 301*b* may be disposed on the mainboard's opposing side 314. Additional components that may be disposed on the mainboard 310 include other IC devices (e.g., processing devices, memory devices, signal processing devices, wireless communication devices, graphics controllers and/or drivers, audio processors and/or controllers, etc.), power delivery components (e.g., a voltage regulator and/or other power management devices, a power supply such as a battery, and/or passive devices such as a capacitor), and one or more user interface devices (e.g., an audio input device, an audio output device, a keypad or other data entry device such as a touch screen display, and/or a graphics display, etc.), as well as any combination of these and/or other devices.

In one embodiment, the computing system 300 includes a radiation shield. In a further embodiment, the computing system 300 includes a cooling solution. In yet another embodiment, the computing system 300 includes an antenna. In yet a further embodiment, the assembly 300 may be disposed within a housing or case. Where the mainboard 310 is disposed within a housing, some of the components of computer system 300—e.g., a user interface device, such as a display or keypad, and/or a power supply, such as a battery—may be electrically coupled with the mainboard 310 (and/or a component disposed on this board) but may be mechanically coupled with the housing.

Figure 4:
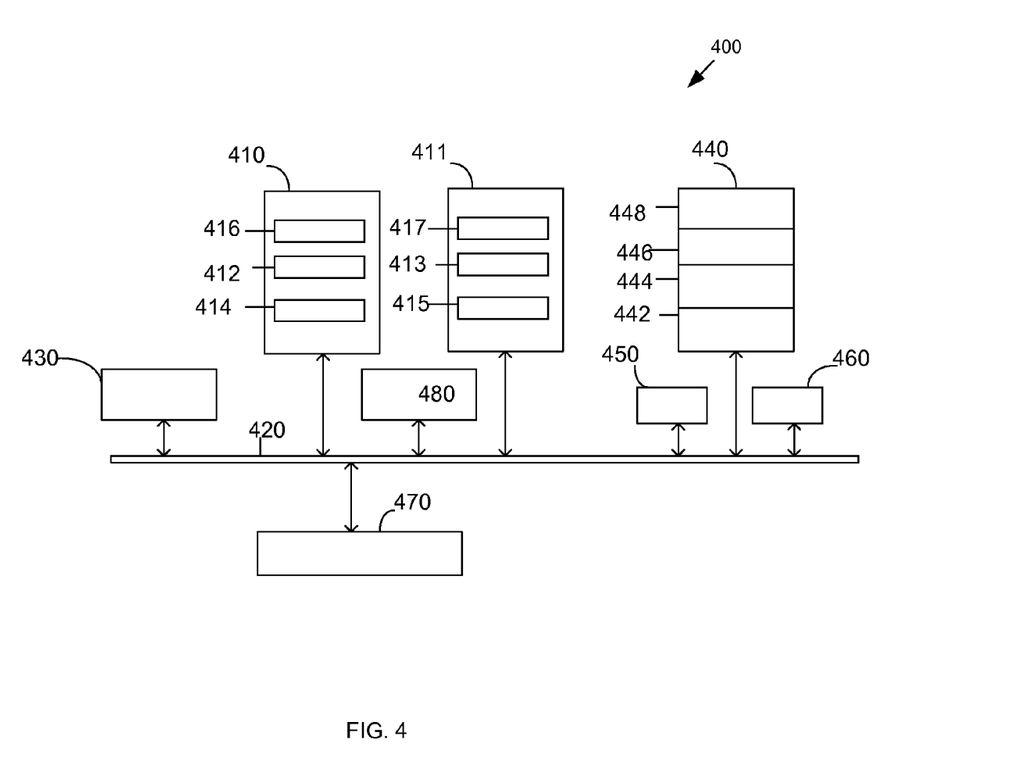
FIG. 4 represents a schematic of a system according to embodiments.

FIG. 4 is a schematic of a computer system 400 according to an embodiment. The computer system 400 (also referred to as the electronic system 400) as depicted can embody/include a package structure/WLUF material that includes any of the several disclosed embodiments and their equivalents as set forth in this disclosure. The computer system 400 may be a mobile device such as a netbook computer. The computer system 400 may be a mobile device such as a wireless smart phone. The computer system 400 may be a desktop computer. The computer system 400 may be a hand-held reader. The computer system 400 may be integral to an automobile. The computer system 400 may be integral to a television.

In an embodiment, the electronic system 400 is a computer system that includes a system bus 420 to electrically couple the various components of the electronic system 400. The system bus 420 is a single bus or any combination of busses according to various embodiments. The electronic system 400 includes a voltage source 430 that provides power to the integrated circuit 410. In some embodiments, the voltage source 430 supplies current to the integrated circuit 410 through the system bus 420.

The integrated circuit 410 is electrically, communicatively coupled to the system bus 420 and includes any circuit, or combination of circuits according to an embodiment, including the package/device of the various embodiments included herein. In an embodiment, the integrated circuit 410 includes a processor 412 that can include any type of packaging structures according to the embodiments herein. As used herein, the processor 412 may mean any type of circuit such as, but not limited to, a microprocessor, a microcontroller, a graphics processor, a digital signal processor, or another processor. In an embodiment, the processor 412 includes any of the embodiments of the package structures disclosed herein. In an embodiment, SRAM embodiments are found in memory caches of the processor.

Other types of circuits that can be included in the integrated circuit 410 are a custom circuit or an application-specific integrated circuit (ASIC), such as a communications circuit 414 for use in wireless devices such as cellular telephones, smart phones, pagers, portable computers, two-way radios, and similar electronic systems. In an embodiment, the processor 412 includes on-die memory 416 such as static random-access memory (SRAM). In an embodiment, the processor 412 includes embedded on-die memory 416 such as embedded dynamic random-access memory (eDRAM).

In an embodiment, the integrated circuit 410 is complemented with a subsequent integrated circuit 411. In an embodiment, the dual integrated circuit 411 includes embedded on-die memory 417 such as eDRAM. The dual integrated circuit 411 includes an RFIC dual processor 413 and a dual communications circuit 415 and dual on-die memory 417 such as SRAM. The dual communications circuit 415 may be configured for RF processing.

At least one passive device 480 is coupled to the subsequent integrated circuit 411. In an embodiment, the electronic system 400 also includes an external memory 440 that in turn may include one or more memory elements suitable to the particular application, such as a main memory 442 in the form of RAM, one or more hard drives 444, and/or one or more drives that handle removable media 446, such as diskettes, compact disks (CDs), digital variable disks (DVDs), flash memory drives, and other removable media known in the art. The external memory 440 may also be embedded memory 448. In an embodiment, the electronic system 400 also includes a display device 450, and an audio output 460. In an embodiment, the electronic system 400 includes an input device such as a controller 470 that may be a keyboard, mouse, touch pad, keypad, trackball, game controller, microphone, voice-recognition device, or any other input device that inputs information into the electronic system 400. In an embodiment, an input device 470 includes a camera. In an embodiment, an input device 470 includes a digital sound recorder. In an embodiment, an input device 470 includes a camera and a digital sound recorder.

Although the foregoing description has specified certain steps and materials that may be used in the methods of the embodiments, those skilled in the art will appreciate that many modifications and substitutions may be made. Accordingly, it is intended that all such modifications, alterations, substitutions and additions be considered to fall within the spirit and scope of the embodiments as defined by the appended claims. In addition, the Figures provided herein illustrate only portions of exemplary microelectronic devices and associated package structures that pertain to the practice of the embodiments. Thus the embodiments are not limited to the structures described herein.

What is claimed is:

1. A method of forming a wafer level underfill (WLUF) material comprising:
   providing a resin material; and
   adding a UV absorber, wherein the UV absorber comprises at least one of a benzophenone, a diphenyl acrylate, a cinnamate or a sterically hindered amine.

2. The method of claim 1 wherein the UV absorber comprises an organic material capable of absorbing in the UV-A portion of the electromagnetic spectrum.

3. The method of claim 1 further comprising adding a sterically hindered amine light stabilizer (HALS) absorber and wherein the HALS absorber comprises at least one of a monomeric sterically hindered amine or an oligomeric sterically hindered amine.

4. The method of claim 1 further comprising applying the WLUF on a top surface of a wafer comprising a plurality of die and adding an organic surface protectant (OSP) absorber to the resin material, and wherein the OSP protects a bump surface disposed on the die from oxidation.

5. The method of claim 1 wherein the UV absorber is soluble in the resin material, wherein the resin further comprises a filler, a hardener, or a surfactant.

6. The method of claim 1 further comprising adding a sterically hindered amine light stabilizer (HALS) absorber and wherein the HALS is capable of reducing a surface roughness of the WLUF material.

7. The method of claim 1 further comprising adding a sterically hindered amine light stabilizer (HALS) absorber and wherein the HALS comprises at least one of Uvinul 4050H, Uvinul 5050 H and Uvinul 3434 C.

8. The method of claim 1 further comprising adding a sterically hindered amine light stabilizer (HALS) absorber and wherein the HALS comprises at least one of Tinuvin P, Irganox 1098, Lavinix BHT, Tinuvin 320, Irganox 1010, Irganox 1076, and Irgafos 168.

9. The method of claim 1 further comprising adding a fluxing agent to form the WLUF material and wherein the fluxing agent comprises at least one of an acid or an activator package.

10. The method of claim 1 further comprising adding a fluxing agent to form the WLUF material wherein the fluxing agent comprises at least one of carboxylic acids, halides, organohalides, or amino acids.

11. The method of claim 1, further comprising adding an organic surface protectant (OSP) to the resin material and wherein the OSP comprises at least one of alkylbenzimidazoles, vinyl benzimidazoles or aryl phenylimidazoles.

12. A method of forming a structure comprising:
coating a wafer with a wafer level underfill material, wherein the wafer comprises a plurality of microelectronic dies, and wherein the wafer level underfill material comprising at least one of a UV absorber, a sterically hindered amine light stabilizer (HALS), an organic surface protectant (OSP) or a fluxing agent;
scribing the wafer to form a singular die having a wafer level underfill material disposed thereon; and
attaching the singular die to a package structure.

13. The method of claim 12 wherein the at least one comprises the OSP and wherein the OSP remains as a coating on conductive bumps disposed on the singular die.

14. The method of claim 12 further comprising wherein the wafer is scribed at a temperature below about 350 degrees Celsius.

15. The method of claim 12 further comprising wherein the at least one comprises the OSP and wherein the OSP is substantially removed during a subsequent solder reflow process.

16. The method of claim 15 wherein the at least one comprises the OSP and wherein the OSP degrades at a temperature above about 350 degrees Celsius.

17. The method of claim 12 further comprising wherein the total amount of the at least UV absorber, the HAL, the OSP or the fluxing agent comprise less than about 10 percent by weight composition of the WLUF material.

18. The method of claim 12 wherein the scribing is performed utilizing a laser scribe process, and wherein the at least one comprises the UV absorber and wherein the UV absorber absorbs the energy frequency of the laser.

19. The method of claim 12 further comprising wherein the at least one comprises the UV absorber and wherein the UV absorber is substantially ablated in scribe alleys of the wafer, and wherein there is little to no debris on and around the plurality of dies.

20. A package structure comprising:
a package substrate;
a die disposed on the package substrate, wherein conductive bumps couple the die to the package substrate; and
an underfill material disposed on conductive bumps and between the device and the package substrate, wherein the underfill material comprises a resin material and a sterically hindered amine light stabilizer (HALS) wherein the HALS comprises at least one of a monomeric sterically hindered amine or a oligomeric sterically hindered amine.

21. The structure of claim 20 wherein the underfill material further comprises a UV absorber and wherein the UV absorber comprises an organic material capable of absorbing in the UV-A portion of the electromagnetic spectrum.

22. The structure of claim 20 wherein the underfill material further comprises an organic surface protectant (OSP), wherein the OSP has OSP dopants and wherein the OSP dopants protect a bump surface from oxidation.

23. The structure of claim 20 wherein the underfill material further comprises a UV absorber and wherein the UV absorber comprises at least one of a benzophenone, a diphenyl acrylate, a cinnamate and a sterically hindered amine.

24. The structure of claim 20 wherein the underfill material further comprises a UV absorber and wherein the UV absorber is soluble in the resin material, wherein the resin further comprises a filler, a hardener, and a surfactant.

25. The structure of claim 20 wherein the HALS is capable of reducing a surface roughness of the underfill material.

26. The structure of claim 20 wherein the HALS comprises at least one of Uvinul 4050H, Uvinul 5050 H and Uvinul 3434 C.

27. The structure of claim 20 wherein the HALS comprises at least one of Tinuvin P, Irganox 1098, Lavinix BHT, Tinuvin 320, Irganox 1010, Irganox 1076, or Irgafos 168.

28. The structure of claim 20 wherein the underfill material further comprises a fluxing agent and wherein the fluxing agent comprises at least one of an acid and an activator package.

29. The structure of claim 20 wherein the underfill material further comprises a fluxing agent and wherein the fluxing agent comprises at least one of carboxylic acids, halides, organohalides, or amino acids.

30. The structure of claim 20 wherein the underfill material further comprises a fluxing agent and wherein the fluxing agent bonds with the conductive bumps and the underfill material.

31. The structure of claim 20 wherein the package structure further comprises at least one of a CPU or a memory die.

32. The structure of claim 20 further comprising a system comprising:
a bus communicatively coupled to the package structure; and
an eDRAM communicatively coupled to the bus.

33. A method of forming a structure comprising:
coating a wafer with a wafer level underfill material, wherein the wafer comprises a plurality of microelectronic dies, and wherein the wafer level underfill material comprising at least one of a UV absorber, a sterically hindered amine light stabilizer (HALS), an organic surface protectant (OSP) or a fluxing agent;
scribing and sawing the wafer to form a singular die wherein the wafer is scribed and sawed at a temperature below about 350 degrees Celsius; and
attaching the singular die to a package structure.

34. A method of forming a structure comprising:
coating a wafer with a wafer level underfill material, wherein the wafer comprises a plurality of microelectronic dies, and wherein the wafer level underfill material comprising an organic surface protectant (OSP);
scribing and sawing the wafer to form a singular die; and
attaching the singular die to a package structure further comprising wherein the OSP is substantially removed during a subsequent solder reflow process and wherein the OSP degrades at a temperature above about 350 degrees Celsius.

35. A method of forming a structure comprising:
coating a wafer with a wafer level underfill material, wherein the wafer comprises a plurality of microelectronic dies, and wherein the wafer level underfill material comprising at least one of a UV absorber, a sterically hindered amine light stabilizer (HALS), an organic surface protectant (OSP) or a fluxing agent;
scribing and sawing the wafer to form a singular die; and
attaching the singular die to a package structure further comprising wherein the total amount of the at least one of the UV absorber, the sterically hindered amine light stabilizer (HALS), the organic surface protectant (OSP) or the fluxing agent comprise less than about 10 percent by weight composition of the WLUF material.

36. A method of forming a wafer level underfill (WLUF) material comprising:
providing a resin material; and
adding a sterically hindered amine light stabilizer (HALS) absorber to form the WLUF material, wherein the HALS is capable of reducing a surface roughness of the WLUF material.

37. A method of forming a wafer level underfill (WLUF) material comprising:
providing a resin material; and
adding a sterically hindered amine light stabilizer (HALS) absorber to form the WLUF material, wherein the HALS comprises at least one of Uvinul 4050H, Uvinul 5050 H or Uvinul 3434 C.

38. A method of forming a wafer level underfill (WLUF) material comprising:
providing a resin material; and
adding a sterically hindered amine light stabilizer (HALS) absorber to form the WLUF material, wherein the HALS comprises at least one of Tinuvin P, Irganox 1098, Lavinix BHT, Tinuvin 320, Irganox 1010, Irganox 1076, or Irgafos 168.

39. A method of forming a wafer level underfill (WLUF) material comprising:
providing a resin material;
adding a sterically hindered amine light stabilizer (HALS) absorber to the resin material, wherein the HALS absorber comprises at least one of a monomeric sterically hindered amine or an oligomeric sterically hindered amine; and
adding at least one of a UV absorber, or an organic surface protectant (OSP), to form the WLUF material.

40. A package structure comprising:
a package substrate;
a die disposed on the package substrate, wherein conductive bumps couple the die to the package substrate; and
an underfill material disposed on conductive bumps and between the device and the package substrate, wherein the underfill material comprises a resin material and a UV absorber, wherein the UV absorber comprises an organic material capable of absorbing in the UV-A portion of the electromagnetic spectrum, and wherein the UV absorber comprises at least one of a benzophenone, a diphenyl acrylate, a cinnamate or a sterically hindered amine.

41. A package structure comprising:
a package substrate;
a die disposed on the package substrate, wherein conductive bumps couple the die to the package substrate; and
an underfill material disposed on conductive bumps and between the device and the package substrate, wherein the underfill material comprises a resin material and a sterically hindered amine light stabilizer (HALS), wherein the HALS is capable of reducing a surface roughness of the underfill material.

42. A package structure comprising:
a package substrate;
a die disposed on the package substrate, wherein conductive bumps couple the die to the package substrate; and
an underfill material disposed on conductive bumps and between the device and the package substrate, wherein the underfill material comprises a resin material and a sterically hindered amine light stabilizer (HALS), wherein the HALS comprises at least one of Uvinul 4050H, Uvinul 5050 H, Uvinul 3434 C, Tinuvin P, Irganox 1098, Lavinix BHT, Tinuvin 320, Irganox 1010, Irganox 1076, or Irgafos 168.

* * * * *